Sept. 17, 1963 L. D. FAVRO ETAL 3,103,733
TREATMENT OF GERMANIUM SEMICONDUCTOR DEVICES
Filed Sept. 4, 1962
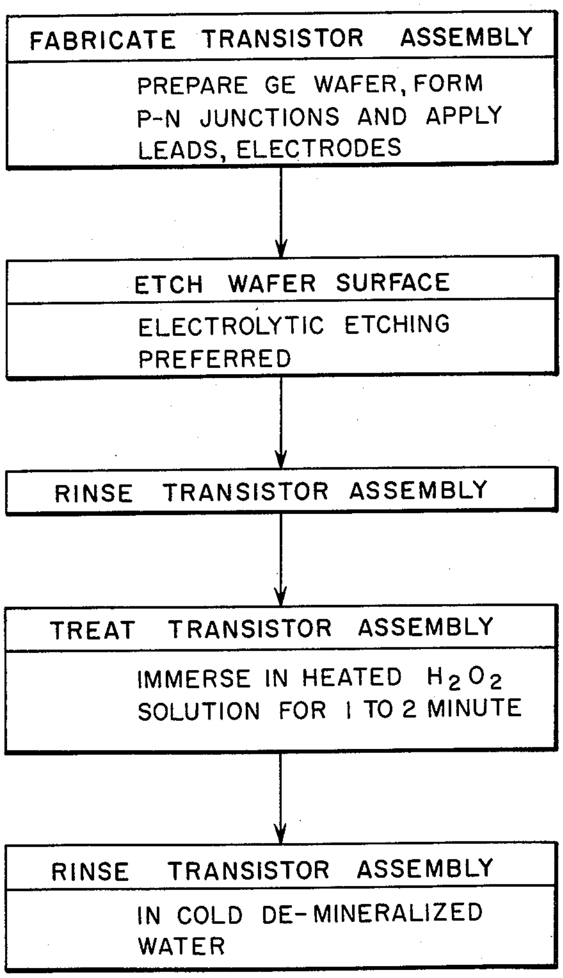
INVENTORS
LAWRENCE D. FAVRO
DANIEL I. POMERANTZ
BY Elmer J. Hyde
ATTORNEY United States Patent Office 3,103,733

Patented Sept. 17, 1963

3,103,733

TREATMENT OF GERMANIUM SEMICONDUCTOR DEVICES

Lawrence D. Favro, New York, N.Y., and Daniel I. Pomerantz, Lexington, Mass., assignors to Clevite Corporation, a corporation of Ohio Filed Sept. 4, 1962, Ser. No. 221,672
3 Claims. (Cl. 29—25.3)

This invention relates to methods for manufacture of semiconductor devices and, more particularly, to a beneficent treatment for germanium transistors and diodes.

This application is a continuation-in-part of United States Serial No. 755,939, filed August 19, 1958, now abandoned, by Lawrence D. Favro and Daniel I. Pomerantz, and assigned to the same assignee as the present invention.

It is a fundamental object of the present invention to provide methods for manufacture of improved germanium transistors and diodes.

A more specific object is the provision of a beneficent treatment for germanium transistors which increases their power and current gain and stability.

Still another object is the provision of a beneficent treatment for germanium transistors and diodes which reduces their saturation current.

These and further objects are accomplished by methods of treating germanium semiconductor devices in accordance with the present invention which includes the step of immersing the device in a heated solution of hydrogen peroxide for a substantial period of time of the order of minutes.

The manner of practicing the invention, its scope, advantages and additional objects will be apparent to those conversant with the art from the following description and subjoined claims taken in conjunction with the annexed drawing which diagrammatically illustrates the various steps for manufacture of a germanium transistor in accordance with an exemplary embodiment of the invention.

As will be seen from the drawing, the basic steps of the method are:

(1) Fabrication of the transistor assembly;
(2) Etching of the assembly;
(3) Rinsing;
(4) Treating the transistor assembly;
(5) Rinsing.

Steps 1, 2 and 3, are, in themselves, more or less conventional and may be carried out according to any suitable technique presently known or hereinafter discovered. For purposes of example, these conventional steps will be explained briefly in connection with a germanium transistor of the alloyed junction type. In the fabrication of a transistor assembly of this type a small body of germanium known as a die or wafer is cut from an ingot of germanium, suitably doped with a donor or acceptor impurity to have the desired conductivity-type, i.e., N-type or P-type. P-N junctions are formed in the wafer by alloying to the respective opposite surfaces an "emitter button" and a "collector button," these being pellets of a selected material which, when alloyed to the wafer produce regions of a conductivity-type opposite to that of the wafer. The interface between the regions of opposite conductivity-type, i.e., the P-type region and the N-type region, is a rectifying barrier or P-N junction. In the case of a diode only one rectifying junction is formed.

Having formed respective P-N junctions for operation as an emitter and a collector, a non-rectifying electrode or connection, known as the base electrode is applied to the wafer. Suitable lead wires are provided individually for the emitter, collector and base regions or electrodes. In some cases, the lead wires are alloyed to the wafer so as to accomplish simultaneously the formation of the junction and the attachment of the lead wire. It is to be understood that, in referring to the fabrication of the transistor assembly, it is the intention of the present description to embrace all techniques for producing a germanium transistor or diode assembly without regard for any particular details of fabrication construction. Some methods of fabrication do not involve a separate procedure for the attachment of leads or electrodes; it will be understood, therefore, that reference herein to fabrication of a semiconductor device or assembly contemplates primarily the formation of a junction or junctions in a body of semiconductor material without regard for, or distinction as to, whether or not electrodes or leads are provided simultaneously or at some later stage. The beneficent treatment hereinafter described may be performed at any time after formation of the junction, provided, of course, that the treatment must be subsequent to any fabrication procedure which would undo the beneficial effects derived therefrom. Generally speaking, any manufacturing operation which would tend to alter the surface condition of the semiconductor body might reverse the effects of, and therefore should be performed prior to, the beneficent treatment.

Following step 1, the transistor assembly is subjected to any suitable etching process. This etching process may be entirely chemical in nature but an electro-chemical etching technique of the type known as "electrolytic etching" is preferred. In electrolytic etching the surface of the wafer is brought into contact with an etchant-electrolyte while a potential gradient is applied across the junctions. Contact of the wafer surface with the etchant may be accomplished by immersion of the wafer in the etchant or by directing a stream of the etchant against its surface.

Following the etching step, the assembly is rinsed, preferably in hot de-mineralized water, to remove the etchant-electrolyte and any residue formed on the wafer. As previously stated, the steps thus far described are, in themselves, conventional and upon their completion, the transistor assembly normally would be ready for mounting and encapsulation.

In accordance with the present invention the transistor or diode assembly at this stage is subjected to a beneficent treatment which comprises immersion of the assembly in a heated solution of hydrogen peroxide ($H_2O_2$). The strength of the solution, its temperature and the period of immersion are inter-related parameters of the treatment process. It has been found that very satisfactory results are obtained with a 35% aqueous solution of $H_2O_2$, maintained at its boiling point (105° C.), and an immersion period of about 2 minutes. Solution concentrations and temperatures as low as 5% and 50° C., respectively, are operative but require increased immersion times. With higher temperatures and/or concentrations shortened immersion periods are permissable. The upper limit of solution strength is about 70% inasmuch as stronger solutions are overly reactive and difficult to handle under production conditions.

A two minute immersion in a 35% solution at its boiling point is the preferred treatment as the solution is sufficiently stable for relatively easy handling and the time and temperatures are well suited to commercial production techniques and facilities.

Following the treatment, the transistor or diode assemblies are rinsed in cold de-mineralized water after which they are ready for mounting and encasement in the normal manner.

Transistors subjected to the treatment described are characterized by increased current and power gain, the latter amounting to from 2 to 6 db, and by greater stability in prolonged life tests at elevated temperature. Thus, for example, the degradation of power gain after 500 hours at 90° C. is reduced from an average of 4 db for untreated units to an average of about 1 db for treated units. Additional effects observed in both transistors and diodes are that the treated junctions have lower saturation currents and they exhibit no evidence of surface channels as to untreated units.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by United States Letters Patent is:

1. The method of fabricating a germanium semiconductor device comprising the following steps:
providing a body of germanium of known conductivity-type;
forming at least one rectifying PN junction on the body;
etching the surface of the body;
rinsing the body;
immersing the body in a 5 to 70 percent solution of hydrogen peroxide maintained at a temperature of from 50 to 105° C., for a period of time selected with reference to the strength and temperature of said solution to be equivalent in effect to immersion for about two minutes in a 35 percent aqueous solution of hydrogen peroxide at its boiling point;
rinsing said body in de-mineralized water; and
applying operating leads subsequent to forming the PN junction.

2. A method of fabricating a germanium semiconductor device comprising the following steps:
providing a body of germanium of known conductivity-type;
forming at least one rectifying PN junction on the body;
etching the surface of the body;
rinsing the body;
immersing the body in a 35 percent aqueous solution of hydrogen peroxide at its boiling point for about two minutes;
rinsing the body in cold de-mineralized water; and
applying leads subsequent to forming the PN junction.

3. A method of fabricating germanium semiconductor devices comprising:
providing a body of germanium of known conductivity-type;
forming at least one rectifying PN junction and providing operating electrodes on said body, to form an assembly;
electrolytically etching the surface of said body;
rinsing said assembly;
immersing said assembly in a 35 percent solution of hydrogen peroxide at its boiling point for a period of about two minutes; and
subsequently rinsing said assembly in cold de-mineralized water.

References Cited in the file of this patent

UNITED STATES PATENTS

| | | |
|---|---|---|
| 2,530,110 | Woodyard | Nov. 14, 1950 |
| 2,650,311 | Bray et al. | Aug. 25, 1953 |
| 2,777,974 | Brattain et al. | Jan. 15, 1957 |
| 2,847,623 | Thornhill | Aug. 12, 1958 |
| 2,917,684 | Becherer | Dec. 15, 1959 |